United States Patent
Kozuma et al.

(10) Patent No.: US 8,686,972 B2
(45) Date of Patent: Apr. 1, 2014

(54) SEMICONDUCTOR DEVICE AND DISPLAY DEVICE

(75) Inventors: Munehiro Kozuma, Kanagawa (JP); Yoshiyuki Kurokawa, Kanagawa (JP); Takayuki Ikeda, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 236 days.

(21) Appl. No.: 12/949,894

(22) Filed: Nov. 19, 2010

(65) Prior Publication Data

US 2011/0122108 A1 May 26, 2011

(30) Foreign Application Priority Data

Nov. 20, 2009 (JP) ................. 2009-264630

(51) Int. Cl.
*G06F 3/042* (2006.01)
*G06F 3/038* (2013.01)
*G09G 5/00* (2006.01)
*G09G 3/36* (2006.01)
*G06F 3/041* (2006.01)

(52) U.S. Cl.
USPC ............ 345/175; 345/207; 345/104; 345/173

(58) Field of Classification Search
USPC ................. 345/173, 175, 104, 207
See application file for complete search history.

(56) References Cited

U.S. PATENT DOCUMENTS

| | | | |
|---|---|---|---|
| 6,674,470 B1 * | 1/2004 | Tanaka et al. ................. | 348/302 |
| 6,747,638 B2 | 6/2004 | Yamazaki et al. | |
| 6,867,811 B2 | 3/2005 | Nakamura et al. | |
| 6,879,344 B1 | 4/2005 | Nakamura et al. | |
| 6,888,571 B1 | 5/2005 | Koshizuka et al. | |
| 7,061,014 B2 | 6/2006 | Hosono et al. | |
| 7,064,346 B2 | 6/2006 | Kawasaki et al. | |
| 7,113,213 B2 * | 9/2006 | Matsunaga et al. .......... | 348/308 |
| 7,123,243 B2 | 10/2006 | Kawasaki et al. | |
| 7,158,129 B2 * | 1/2007 | Nakajima ...................... | 345/207 |
| 7,282,782 B2 | 10/2007 | Hoffman et al. | |

(Continued)

FOREIGN PATENT DOCUMENTS

| | | |
|---|---|---|
| EP | 1134811 A1 | 9/2001 |
| EP | 1359499 A2 | 11/2003 |

(Continued)

OTHER PUBLICATIONS

European Search Report, European Application No. 10191841.5, dated Nov. 28, 2011, 7 pages.

(Continued)

*Primary Examiner* — Alexander S Beck
*Assistant Examiner* — Nguyen H Truong
(74) *Attorney, Agent, or Firm* — Fish & Richardson P.C.

(57) ABSTRACT

It is an object to perform imaging a high-resolution image in a display device including a photosensor regardless of the intensity of incident light on the photosensor. A display device including a display panel which is provided a photosensor and having a function of imaging by a change of the sensitivity of the photosensor in accordance with the incident light is provided. The sensitivity of the photosensor is improved when the intensity of the incident light is low, so that the imaging accuracy is improved; therefore, misperception of contact is prevented and an obtained image can be clear.

20 Claims, 14 Drawing Sheets

(56) References Cited

U.S. PATENT DOCUMENTS

| | | |
|---|---|---|
| 7,323,356 B2 | 1/2008 | Hosono et al. |
| 7,522,149 B2 | 4/2009 | Nakamura et al. |
| 7,525,523 B2 | 4/2009 | Yamazaki et al. |
| 7,674,650 B2 | 3/2010 | Akimoto et al. |
| 7,800,594 B2 | 9/2010 | Nakamura et al. |
| 2003/0076295 A1 | 4/2003 | Nakajima |
| 2006/0170658 A1 | 8/2006 | Nakamura et al. |
| 2006/0244107 A1 | 11/2006 | Sugihara et al. |
| 2007/0108446 A1 | 5/2007 | Akimoto |
| 2007/0194379 A1 | 8/2007 | Hosono et al. |
| 2008/0170239 A1* | 7/2008 | Uemura et al. ............... 356/620 |
| 2009/0033850 A1 | 2/2009 | Ishiguro et al. |
| 2009/0040174 A1 | 2/2009 | Yamashita |
| 2009/0117364 A1 | 5/2009 | Tsuchiya et al. |
| 2009/0122024 A1 | 5/2009 | Nakamura et al. |
| 2009/0141046 A1 | 6/2009 | Rathnam et al. |
| 2009/0207194 A1 | 8/2009 | Wang et al. |
| 2010/0053348 A1* | 3/2010 | Yoshimoto et al. ........ 348/218.1 |
| 2010/0085331 A1 | 4/2010 | Kurokawa et al. |
| 2010/0141623 A1* | 6/2010 | Nakanishi et al. ............ 345/207 |
| 2011/0122098 A1 | 5/2011 | Kurokawa |
| 2011/0175871 A1* | 7/2011 | Katoh et al. .................. 345/207 |
| 2011/0199349 A1* | 8/2011 | Katoh ........................... 345/207 |
| 2012/0013595 A1* | 1/2012 | Murai et al. .................. 345/211 |
| 2012/0013650 A1* | 1/2012 | Mizubuchi .................... 345/690 |

FOREIGN PATENT DOCUMENTS

| | | |
|---|---|---|
| JP | 05-251705 A | 9/1993 |
| JP | 2000-044236 A | 2/2000 |
| JP | 2000-150900 A | 5/2000 |
| JP | 2000-331557 A | 11/2000 |
| JP | 2001-292276 A | 10/2001 |
| JP | 2002-076356 A | 3/2002 |
| JP | 2002-289859 A | 10/2002 |
| JP | 2003-296022 A | 10/2003 |
| JP | 2004-318819 A | 11/2004 |
| JP | 2005-033172 A | 2/2005 |
| JP | 2006-243927 A | 9/2006 |
| WO | 01/35638 A1 | 5/2001 |
| WO | WO 03/040441 A1 | 5/2003 |

OTHER PUBLICATIONS

European Office Action (Application No. 10191841.5) dated Jul. 31, 2013, in English.

Kamiya. T et al., "1a-F-5 Room temperature fabrication and carrier transport of amorphous semiconductor exhibiting large electron Hall mobilities > 10 cm2/Vs,", (The 65th Autumn Meeting, 2004) The Japan Society of Applied Physics, Sep. 1, 2004, No. 2, p. 791 (full English translation).

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Nomura.K et al., "Thin-Film Transistor Fabricated in Single-Crystalline Transparent Oxide Semiconductor,", Science, May 23, 2003, vol. 300, No. 5623, pp. 1269-1272.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Nomura. K et al., "31a-ZA-6 Carrier Transport in Transparent Amorphous Oxide Semiconductor InGaZnO4,", (The 51st Spring Meeting,2004); The Japan Society of Applied Physics and Related Societies, Mar. 28, 2004, No. 2, p. 669 (full English translation).

* cited by examiner

SEMICONDUCTOR DEVICE AND DISPLAY DEVICE

BACKGROUND OF THE INVENTION

1. Field of the Invention

The technical field relates to a display device and a driving method thereof. In particular, the technical field relates to a display device including a photosensor and a driving method thereof. Further, the technical field relates to a semiconductor device and a driving method thereof.

2. Description of the Related Art

In recent years, a display device provided with a touch sensor has attracted attention. The display device provided with a touch sensor is called a touch panel, a touch screen, or the like (hereinafter referred to simply as a touch panel). Examples of the touch sensor include a resistive touch sensor, a capacitive touch sensor, and an optical touch sensor which are different in operation principle. With the touch sensor, an object (e.g., a pen and a finger) touching a display device can be detected. Therefore, data for controlling the display device can be input by the use of the touch sensor as an input device. In addition, a display device including an optical touch sensor can be also used as a contact area sensor (e.g., Patent Document 1).

Further, as an example of a device without a display panel, a semiconductor device such as an image sensor can be given.

REFERENCE

[Patent Document 1] Japanese Published Patent Application No. 2001-292276

SUMMARY OF THE INVENTION

Such a display device including a photosensor has a problem in that imaging accuracy is decreased when the intensity of the incident light on the photosensor is excessively high or low. The imaging accuracy is decreased, so that the position of the detected object is recognized wrongly or obtained images are unclear. In particular, the display device is easily affected by light from the outside (external light).

In the view of the above problems, it is an object to perform imaging a high-resolution image regardless of the intensity of incident light.

One embodiment of a display device includes a display panel provided with a photosensor in a pixel and has a function in which incident light is measured by the photosensor and the sensitivity of the photosensor changes depending on the incident light.

Alternatively, another example of a display device includes a display panel provided with a photosensor in a pixel and has the following function: a first imaging is performed in the photosensor to generate an image of an object, incident light on the photosensor is measured based on the image, the sensitivity of the photosensor is changed in accordance with the incident light, and then, a second imaging is performed.

That is, the photosensor provided in the pixel has a function of measuring the incident light and a function of imaging an object. As a method for measuring the incident light, the brightness (luminance) of an image may be detected with a concentration histogram of imaged images.

In order to change the sensitivity, voltage applied to the photosensor may be adjusted.

Alternatively, the photosensor includes a transistor and a photodiode electrically connected to a gate of the transistor, and the sensitivity of the photosensor may be changed by adjustment of voltage applied to the photodiode.

Alternatively, the sensitivity of the photosensor may be changed by adjustment of voltage applied between a source and a drain of the transistor.

Alternatively, the photosensor has a function of performing reset operation, accumulating operation, and selecting operation, and the sensitivity of the photosensor may be changed by adjustment of time for the accumulating operation. Note that the accumulating operation is operation performed after initialization in the reset operation and before reading in the selecting operation.

Alternatively, the display device may include an image processing portion. When a binarizing process is performed in the image processing portion, the accuracy of imaging may be adjusted by a change in the threshold value of the binarizing.

Alternatively, another embodiment of a display device includes a display panel in which a first photosensor provided in a pixel and a second photosensor provided outside the pixel are arranged. The embodiment of a display device has a function of measuring incident light by the second photosensor, and changing the sensitivity of the first photosensor in accordance with the incident light before imaging is performed. That is, the first photosensor provided in a pixel has a function of imaging an object and the second photosensor provided outside the pixel has a function of measuring incident light. The sensitivity of a photosensor is changed in the same manner as the above.

The sensitivity of a photosensor is determined by the intensity of incident light, so that imaging a high-resolution image can be always performed. In particular, the sensitivity of the photosensor can be hardly affected by external light.

DETAILED DESCRIPTION OF THE INVENTION

Figure 1:
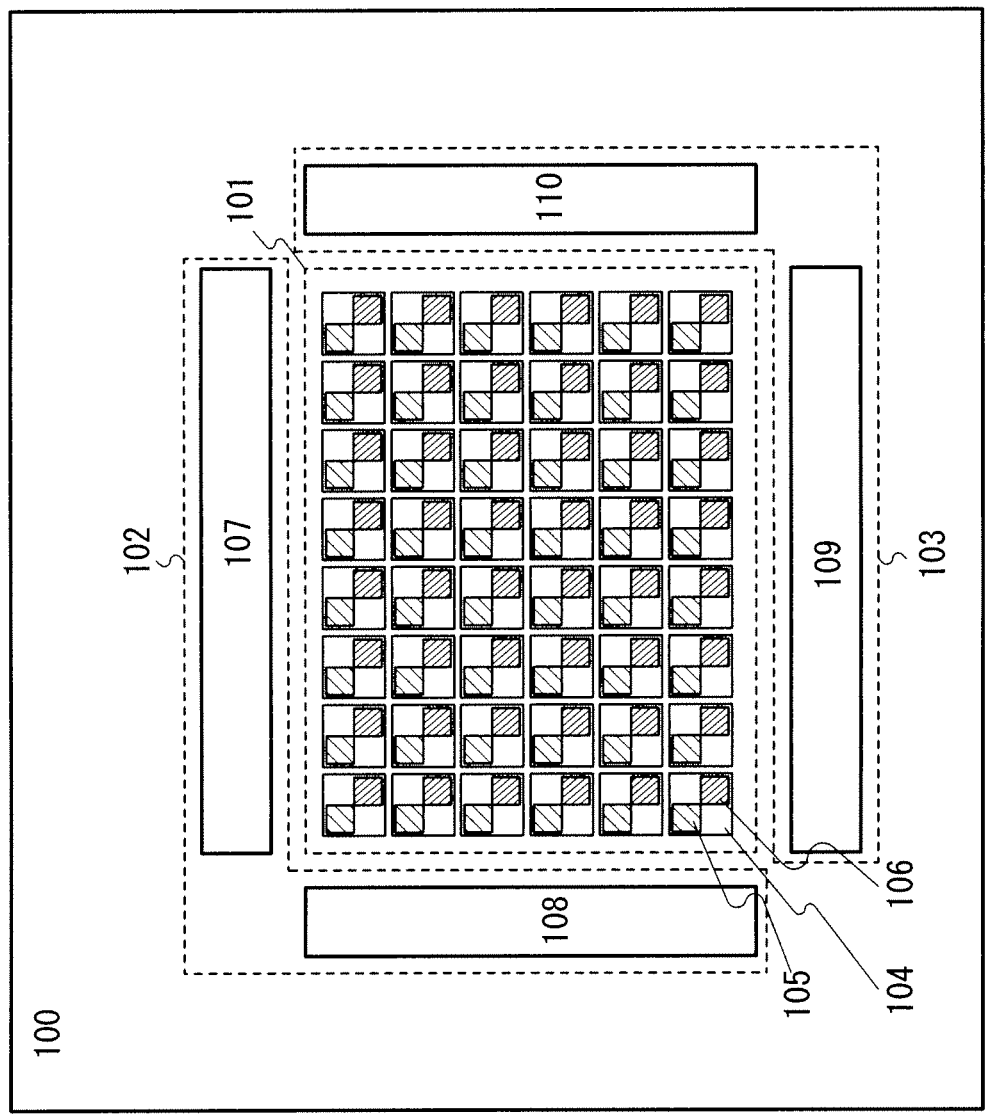
FIG. 1 is an explanatory diagram of a structure of a display device.

Hereinafter, embodiments will be described in detail with reference to the accompanying drawings. However, embodiments described below can be embodied in many different modes, and it is easily understood by those skilled in the art that the mode and the detail can be variously changed without departing from the spirit and the scope of the present invention. Therefore, the present invention should not be interpreted as being limited to the following description of the embodiments. In the drawings for describing the embodiments, the same parts or parts having a similar function are denoted by the same reference numerals, and description of such parts is not repeated.

(Embodiment 1)

In this embodiment, a display device is described with reference to FIG. 1, FIG. 2, FIG. 3, and FIG. 4.

The structure of the display panel will be described with reference to FIG. 1. A display panel 100 includes a pixel circuit 101, a display element control circuit 102, and a photosensor control circuit 103. The pixel circuit 101 includes a plurality of pixels 104 arranged in a matrix of rows and columns. Each of the pixels 104 includes a display element 105 and a photosensor 106. The photosensor 106 can detect and image an object which is touched or close to the display panel 100. Note that the photosensor 106 may be provided outside the pixel 104. Further, the number of photosensors 106 may be different from that of display elements 105.

Each of the display elements 105 includes a thin film transistor (TFT), a storage capacitor, a liquid crystal element, and the like. The thin film transistor has a function of controlling injection or discharge of charge to/from the storage capacitor. The storage capacitor has a function of holding charge which corresponds to voltage applied to the liquid crystal element. Whether light is transmitted or not is controlled by voltage applied to the liquid crystal element, so that grayscale is displayed. Light which a light source (a backlight) emits from the rear side of a liquid crystal display device is used as the light which passes through the liquid crystal layer.

Note that the case where each of the display elements 105 includes a liquid crystal element is described above; however, other elements such as a light emitting element may be included. The light emitting element is an element in which the luminance is controlled by current or voltage. Specifically, a light emitting diode, an OLED (organic light emitting diode), and the like can be given.

The photosensor 106 includes a transistor and an element (a light receiving element) which has a function of generating an electric signal by receiving light. As the light receiving element, a photodiode or the like can be used. Note that the photosensor 106 detects an object by judging with light incident on the display panel 100 whether external light is shaded by the object to cast a shade or the external light is entered. In addition, light emitted from a back light and reflected off the object can also be used. Both of external light and reflected light may be used.

The display element control circuit 102 controls the display elements 105 and includes a display element driver circuit 107 which inputs a signal to the display elements 105 through signal lines (also referred to as source signal lines) such as video-data signal lines; and a display element driver circuit 108 which inputs a signal to the display elements 105 through scanning lines (also referred to as gate signal lines). For example, the display element driver circuit 108 for driving the scanning line has a function of selecting the display element included in the pixel placed in a particular row. In addition, the display element driver circuit 107 for driving the signal line has a function of applying a predetermined potential to the display element included in the pixel placed in a selected row. Note that in the display element to which the display element driver circuit 108 for driving the scanning line applies high potential, the thin film transistor is in a conducting state, so that the display element is supplied with charge from the display element driver circuit 107 for driving the signal line.

The photosensor control circuit 103 controls the photosensors 106 and includes a photosensor reading circuit 109 for driving the signal line such as a photosensor output signal line and a photosensor reference signal line and a photosensor driver circuit 110 for driving the scanning line. The photosensor driver circuit 110 for driving the scanning line has a function of performing reset operation and selecting operation on the photosensor 106 included in the pixel 104 placed in a particular row, which is described below. Further, the photosensor reading circuit 109 for driving the signal line has a function of extracting an output signal of the photosensor 106 included in the pixel in the selected row. Note that the photosensor reading circuit 109 for driving the signal line can have a structure in which an output of the photosensor, which is an analog signal, is extracted as an analog signal to the outside of the display device by an OP amplifier; or a structure in which the output is converted into a digital signal by an A/D converter circuit and then extracted to the outside of the display device.

A circuit diagram of the pixel 104 will be described with reference to FIG. 2. The pixel 104 includes the display element 105 including a transistor 201, a storage capacitor 202, and a liquid crystal element 203, and the photosensor 106 including a photodiode 204, a transistor 205, and a transistor 206.

A gate of the transistor 201 is electrically connected to a gate signal line 207, one of a source and a drain of the transistor 201 is electrically connected to a video data signal line 210, and the other one of the source and the drain of the transistor 201 is electrically connected to one electrode of the storage capacitor 202 and one electrode of the liquid crystal element 203. The other electrode of the storage capacitor 202 and the other electrode of the liquid crystal element 203 are each held at a certain potential. The liquid crystal element 203 includes a pair of electrodes and a liquid crystal layer sandwiched between the pair of electrodes.

When "H" (high-level voltage) is applied to the gate signal line 207, the transistor 201 applies the potential of the video data signal line 210 to the storage capacitor 202 and the liquid crystal element 203. The storage capacitor 202 holds the applied potential. The liquid crystal element 203 changes light transmittance in accordance with the applied potential.

One electrode of the photodiode 204 is electrically connected to a photodiode reset signal line 208, and the other electrode of the photodiode 204 is electrically connected to a gate of the transistor 205. One of a source and a drain of the transistor 205 is electrically connected to a photosensor reference signal line 212, and the other of the source and the drain of the transistor 205 is electrically connected to one of a source and a drain of the transistor 206. A gate of the transistor 206 is electrically connected to a reading signal line 209, and the other of the source and the drain of the transistor 206 is electrically connected to a photosensor output signal line 211.

Figure 3:
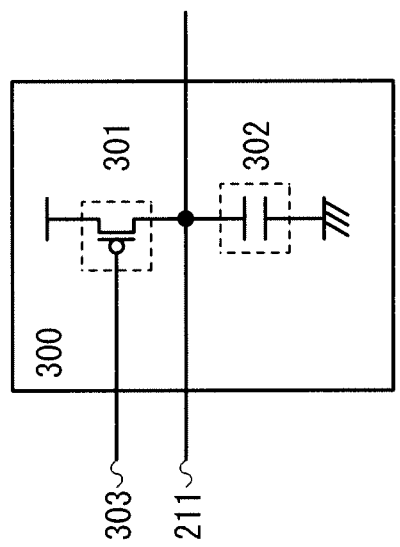
FIG. 3 is an explanatory diagram of a structure of a display device.

Next, the structure of the photosensor reading circuit 109 will be described with reference to FIG. 3. In FIG. 3, a photosensor reading circuit 300 for one column of pixels includes a p-channel transistor 301 and a storage capacitor 302. Further, the photosensor reading circuit 109 includes a photosensor output signal line 211 and a precharge signal line 303 which are for the one column of pixels.

In the photosensor reading circuit 300, the potential of the photosensor output signal line 211 is set to a reference potential before the operation of the photosensor in the pixel. In FIG. 3, by setting a potential of the precharge signal line 303 to "L" (low-level voltage), the potential of the photosensor output signal line 211 can be set to a high potential which is a reference potential. Note that it is acceptable that the storage capacitor 302 is not provided if the photosensor output signal line 211 has large parasitic capacitance. Note that the reference potential can also be a low potential. In that case, an n-channel transistor is used and the potential of the precharge signal line 303 is set to "H", whereby the potential of the photosensor output signal line 211 can be set to a low potential which is a reference potential.

Figure 4:
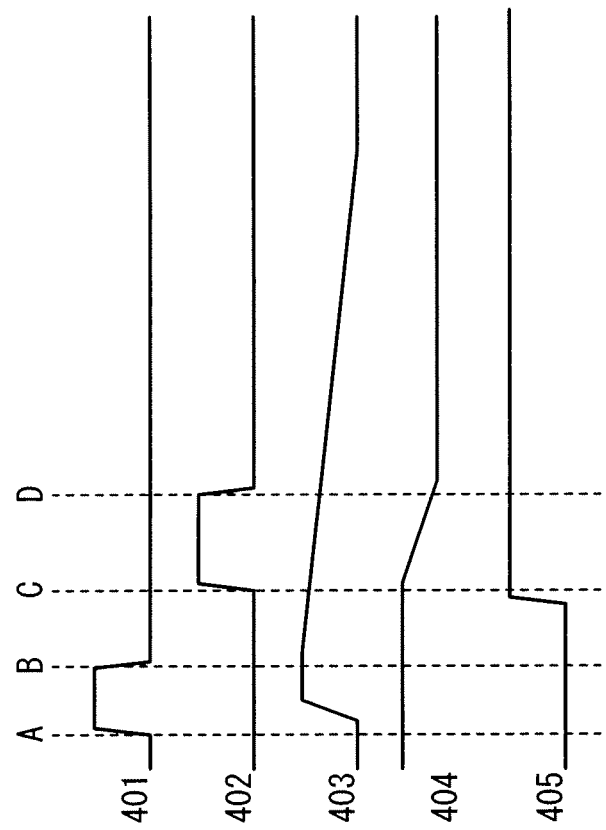
FIG. 4 is a timing chart.

Next, a reading operation of the photosensor of the display panel will be described with reference to a timing chart of FIG. 4. In FIG. 4, a signal 401 corresponds to the potential of the photodiode reset signal line 208 in FIG. 2, a signal 402 corresponds to the potential of the reading signal line 209 in FIG. 2 to which the gate of the transistor 206 is connected, a signal 403 corresponds to the potential of a gate signal line 213 in FIG. 2 to which the gate of the transistor 205 is connected, and a signal 404 corresponds to the potential of the photosensor output signal line 211 in FIG. 2. Further, a signal 405 corresponds to the potential of the precharge signal line 303 in FIG. 3

At a time A, when the potential of the photodiode reset signal line 208 (the signal 401) is set to "H" (reset operation), the photodiode 204 is in a conducting state and the potential of the gate signal line 213 (the signal 403) to which the gate of the transistor 205 is connected becomes "H". Further, when the potential of the precharge signal line 303 (the signal 405) is set to "L", the potential of the photosensor output signal line 211 (the signal 404) is precharged to "H".

At a time B, when the potential of the photodiode reset signal line 208 (the signal 401) is set to "L" (accumulating operation), the potential of the gate signal line 213 (the signal 403) to which the gate of the transistor 205 is connected begins to be lowered due to the off current of the photodiode 204. The off current of the photodiode 204 increases when light is delivered thereto; therefore, the potential of the gate signal line 213 (the signal 403) to which the gate of the transistor 205 is connected varies in accordance with the amount of the light delivered to the photodiode 204. That is, current between a source and a drain of the transistor 205 varies.

At a time C, when the potential of the reading signal line 209 (the signal 402) is set to "H" (selecting operation), the transistor 206 is turned on and the photosensor reference signal line 212 and the photosensor output signal line 211 establish electrical continuity through the transistor 205 and the transistor 206. Then, the potential of the photosensor output signal line 211 (the signal 404) is lowered. Note that previous to the time C, the potential of the precharge signal line 303 (the signal 405) is set to "H" and the precharge of the photosensor output signal line 211 is completed. Here, a speed with which the potential of the photosensor output signal line 211 (the signal 404) is lowered depends on the source-drain current of the transistor 205. That is, the speed with which the potential of the photosensor output signal line 211 varies in accordance with the amount of light delivered to the photodiode 204.

At a time D, when the potential of the reading signal line 209 (the signal 402) is set to "L", the transistor 206 is turned off, and the potential of the photosensor output signal line 211 (the signal 404) has a constant value after the time D. Here, the value as the constant value varies in accordance with the amount of light delivered to the photodiode 204. Therefore, the amount of light delivered to the photodiode 204 can be found by obtaining the potential of the photosensor output signal line 211.

As described above, operation of individual photo sensors is realized by repeating reset operation, accumulating operation, and selecting operation. The reset operation, the accumulating operation, and the selecting operation are performed in photosensors of all of the pixels in the display device, so that an object which is touched or close to the display panel can be imaged.

Here, in the case where the intensity of incident light on the display panel 100 is excessively high, the accuracy of imaging is decreased and it is possible that an image is unclear. In particular, the accuracy of imaging is easily affected by external light as an external environment.

In such a case, the sensitivity of the photosensor 106 is changed in accordance with the intensity of the incident light on the display panel 100, so that the accuracy of imaging can be improved.

A procedure may be as follows: the incident light on the photosensor 106 in imaging is measured based on an imaged image of an object, the sensitivity of the photosensor 106 is optimized in accordance with the intensity of the incident light, and imaging is performed again by the photosensor 106 having the optimized sensitivity.

The incident light is measured based on the imaged image, so that the sensitivity can be automatically adjusted to be the most favorable sensitivity for the image. The method of changing the sensitivity will be described below.

Figure 13:
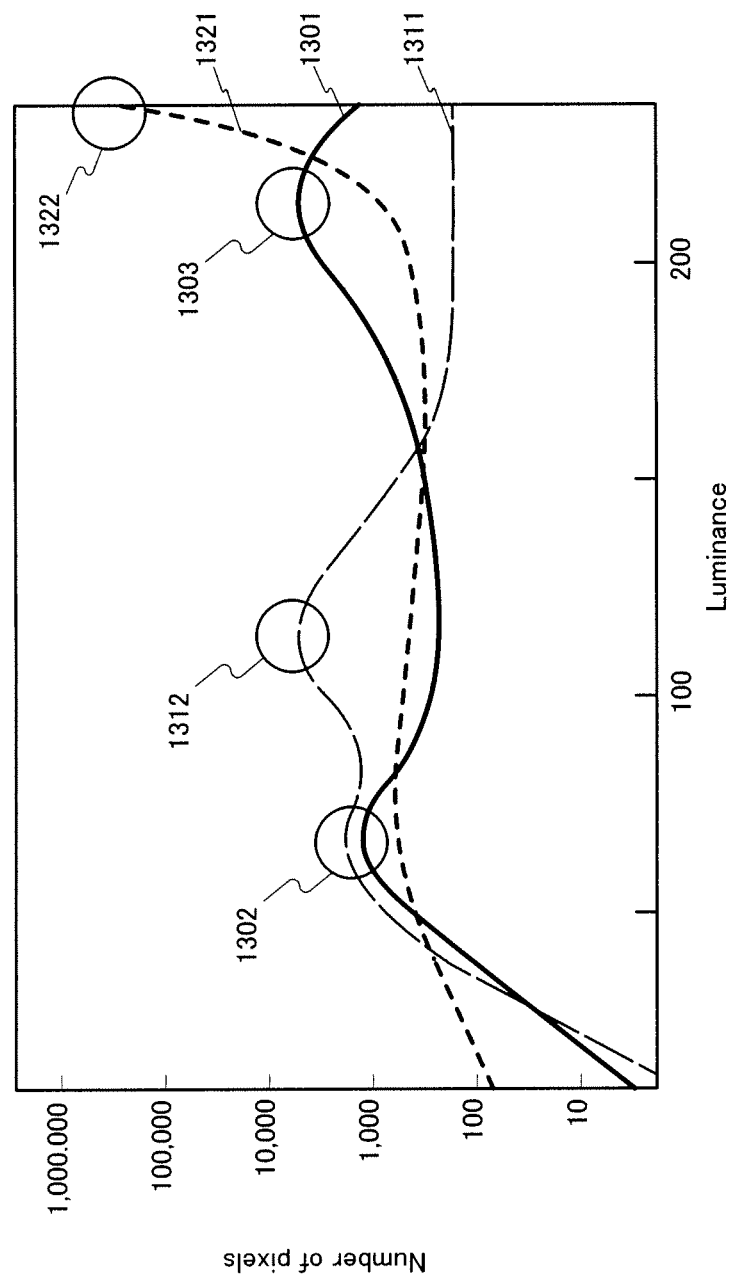
FIG. 13 is a histogram.

First, the intensity of the incident light is judged by a histogram of the luminance of the image of the imaged object. FIG. 13 illustrates a histogram, in which the vertical axis indicates the number of pixels and the horizontal axis indicates the value of the luminance. The minimum limit value of the luminance is zero and the maximum limit value of the luminance is two hundred and fifty five.

Then, the intensity of the incident light is judged from the histogram. For example, a histogram represented by a solid line 1301 in FIG. 13 has two separated peaks of the luminance values, a peak 1302 indicating the position of the detected object of the object and a peak 1303 indicating a position except for the position of the detected object. That is, the brightness and the darkness of the imaged image are clearly divided, so that it is judged that the incident light is appropriate.

Further, a histogram represented by a dashed line 1311 indicates the incident light of low intensity. The two luminance values of the peak 1302 indicating the position of the detected object of the object and a peak 1312 indicating a position except for the position of the detected object are close to each other. When the two luminance values further become close to each other, only one peak can be recognized. That is, since distinction between the brightness and darkness of the imaged image is unclear, it is difficult to recognize the object accurately, which can make it difficult to judge the position of the detected object.

Furthermore, a histogram represented by a dashed line 1321 indicates the case of incident light of high intensity. Only one peak of a peak 1322 indicating a position except for the position of the detected object can be recognized. That is, since distinction between the brightness and darkness of the imaged image is unclear, it is difficult to recognize the object accurately, which can make it difficult to judge the position of the detected object.

In this manner, in the histogram, when the two luminance values of peaks are close to each other or only one peak can be recognized, it is judged that the intensity of incident light is excessively low or high.

The intensity of the incident light on the display panel 100 may be calculated from the luminance of the imaged image. The maximum limit value and the minimum limit value are set for the intensity of the incident light. When the measured intensities from the maximum limit value to the minimum limit value, it is judged that the intensity of the incident light is appropriate. However, when the intensity is less than the minimum limit value (or the minimum limit value or less), it is judged that the intensity of the incident light is excessively low. On the other hand, when the intensity is the maximum limit value or more, it is judged that the intensity of the incident light is excessively high.

Then, when the intensity of the incident light is excessively low or high, the sensitivity of the photosensor is changed. The change of the sensitivity helps to obtain two separated peaks of the intensity values, so that an image can be clear.

Figure 2:
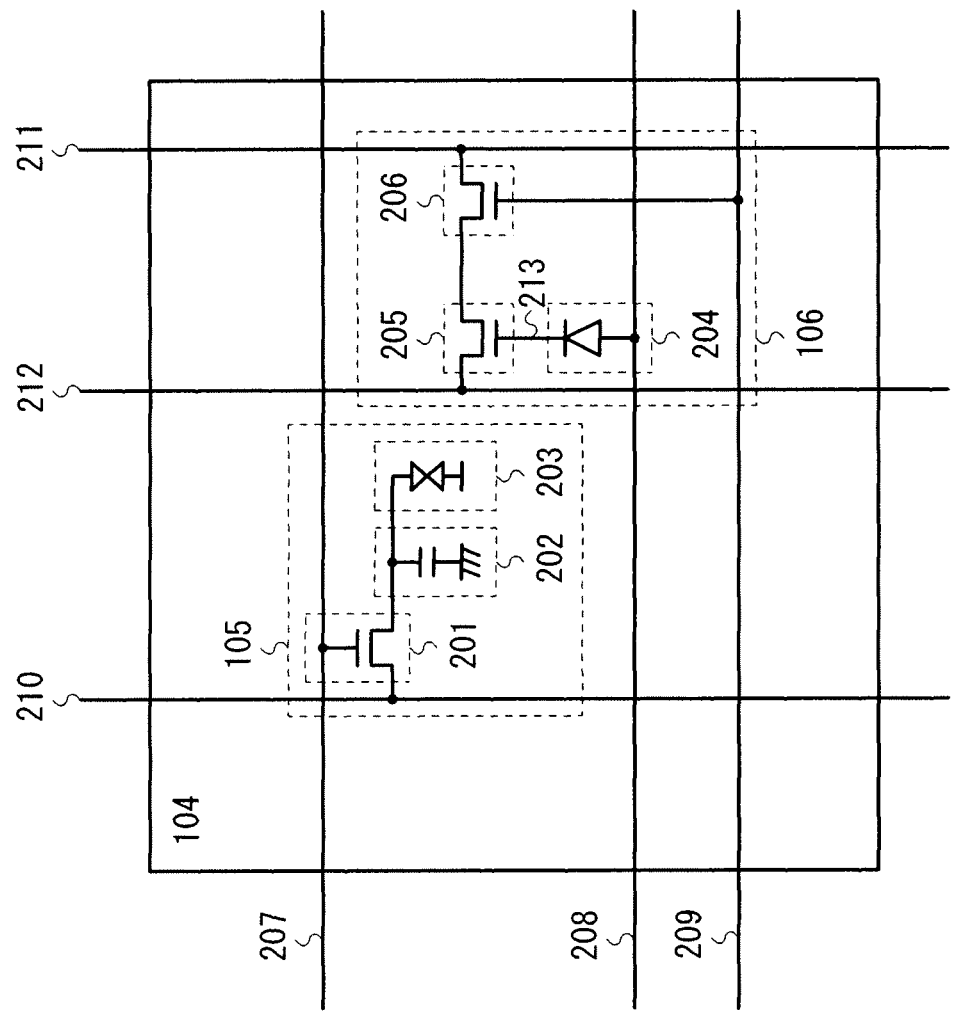
FIG. 2 is an explanatory diagram of a structure of a display device.

As a specific method of changing the sensitivity, the following methods are effective in the structure of FIG. 2: (1) the potential (the signal 401) of the photodiode reset signal line 208 is changed and a voltage applied to the photodiode 204, that is, a voltage (the signal 403) applied to the gate of the transistor 205 is changed; (2) a potential difference between the potential of the photosensor reference signal line 212 and the potential (the signal 405) of the precharge signal line 303 is changed, and a voltage applied between the source and the drain of the transistor 205 is changed; and (3) the length of time for the accumulating operation of the photosensor 106 (the accumulating operation time: the time between the time B and the time C) is changed. Further, it is also effective that the sensitivity is changed by combination of these methods.

In the method (1), a voltage applied to the photodiode 204 is increased, so that the capacity of accumulating light is enlarged; accordingly, the sensitivity of the photosensor 106 is improved. In the method (2), the voltage between the source and the drain of the transistor 205 is increased, so that the accumulation capacity of light is enlarged; therefore, the sensitivity of the photosensor 106 is improved. Then, in the method (3), the accumulating time is made to be longer, so that time for accumulating light becomes longer; therefore, the sensitivity of the photosensor 106 is improved. By the methods (1) to (3), even under circumstances in which the intensity of the incident light is low because of external light of low intensity, the sensitivity of the photosensor and the accuracy of imaging can be improved. In addition, in the case where the intensity of the incident light is high, operation for the processing may be reversely performed to decrease the sensitivity of the photosensor 106, so that the accuracy of imaging may be improved.

Further, the display device including a photosensor can perform detection not only when an object is touched to the display panel but also when the object is not touched to the display panel. However, it is more difficult to detect the object which is not touched than the object which is touched. That is because the shade of the object fades as the object moves away from the display panel; accordingly, it becomes difficult to distinguish between brightness and darkness. Therefore, the sensitivity is improved using the methods (1) to (3), so that imaging a high-resolution image can be performed with respect to the object which is not touched.

Note that the above change of the sensitivity can be manually performed. In the case of performing manually, the incident light is not necessarily measured and the methods (1) to (3) may be performed appropriately in considering the brightness of an imaged image, or the like.

Note that when the incident light is measured, the luminance of an imaged image of the object is not necessarily used. For example, before imaging, the incident light may be measured in advance using part of or all of the photosensors provided in pixels. Note that the case where the incident light is measured based on the luminance of the imaged image is more effective because the sensitivity can be changed in accordance with the image.

Further, the luminance of light reflected off an object can be adjusted by the adjustment of the brightness of the back light. The adjustment is effective especially under the circumstances in which the intensity of external light is excessively low.

By employing such a mode, the sensitivity of a photosensor is changed in accordance with the intensity of incident light or the thickness of a shade, so that imaging a high-resolution image can be always performed.

Note that the display device including a photosensor is described in this embodiment, and this embodiment can be easily applied to a semiconductor device including a photosensor. That is, the semiconductor device can be formed in such a manner that the display element 105 and a circuit needed for display, specifically the display device control circuit 102 are removed from the display device in this embodiment. As an example of the semiconductor device, an image sensor can be given. Such a semiconductor device can detect a contact object or is close to an input portion including a photosensor as above.

This embodiment can be implemented in combination with any of other embodiments and examples as appropriate.
(Embodiment 2)

In this embodiment, a method of measuring incident light which is different from that in Embodiment 1 will be described with reference to FIG. 5.

Figure 5:
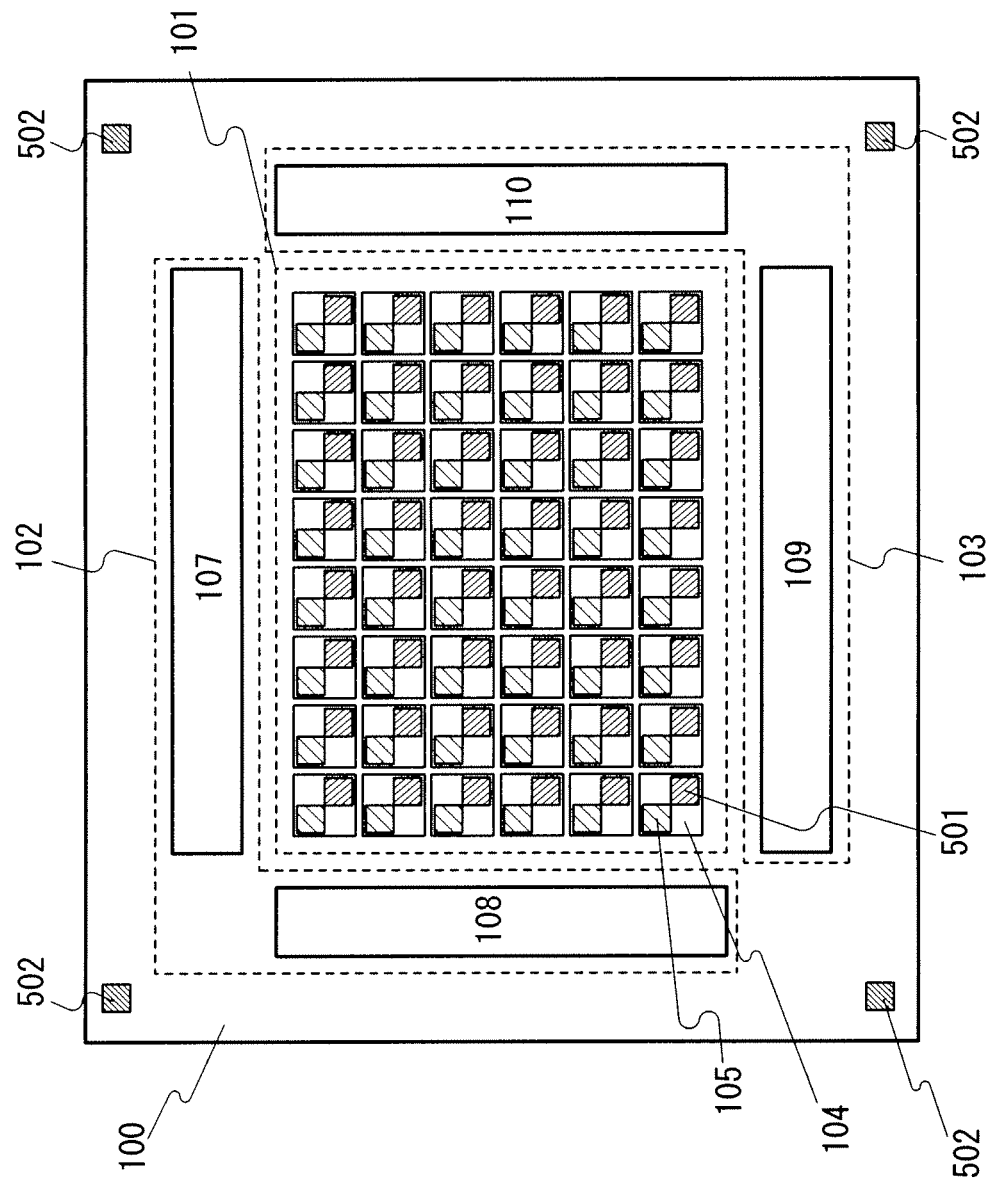
FIG. 5 is an explanatory diagram of a structure of a display device.

FIG. 5 illustrates an example of a display panel. A structure in FIG. 5 is different from that in FIG. 1 in that a second photosensor 502 is provided outside a pixel. The second photosensor 502 measures external light as incident light on the display panel 100. Note that the second photosensor 502 may be provided outside the display panel 100.

In this embodiment, the incident light is measured with the second photosensor 502 in advance, and the sensitivity of a first photosensor 501 provided in the pixel 104 is adjusted in accordance with the intensity of the incident light by using the method described in Embodiment 1 before an object is detected. The sensitivity is changed in accordance with the incident light, so that imaging a high-resolution image can be performed. In this case, the process of measuring the intensity of the incident light based on the luminance of the imaged image can be omitted.

Further, the number of the second photosensors 502 may be one or more. In the case of a plurality of the second photosensors 502, it is possible to use the maximum limit value, the minimum limit value, or the average value of the intensities of the incident light obtained by the plurality of the second photosensors 502, as appropriate. The average value is usually used, and it is preferable that the maximum limit value be used when the difference between the maximum limit value and the minimum limit value is large because it is highly possible that any of the second photosensors 502 is blocked. Moreover, when both the maximum limit value and the minimum limit value are small, it is preferable that the minimum limit value be used because it is highly possible that the intensity of external light is low. Note that when there is one second photosensor 502, it is possible that the sensitivity cannot be appropriately adjusted in the case where the second photosensor 502 is locally blocked because the intensity of the incident light is wrongly regarded as low. Accordingly, it is preferable that the plurality of the second photosensors 502 be provided in order to avoid such a misperception. In addition, it is preferable that in order to prevent such misperception, the second photosensors 502 are provided in at least four corners of the display panel 100 because the entire display panel 100 can be thoroughly detected with the second photosensors 502.

This embodiment can be implemented in combination with any of other embodiments and examples as appropriate.

(Embodiment 3)

In this embodiment, a structure in which an imaged image of an object is subjected to image processing in accordance with the intensity of the incident light will be described.

The imaged image of the object is subjected to a binarizing process as image processing. The binarizing process is a process in which the imaged image of the detected object is recognized anew in each pixel as either a bright portion or a dark portion relative to the predetermined brightness (threshold value). Here, threshold value of the binarizing process is changed in accordance with the intensity of the incident light, so that imaging with imaging a higher-resolution image can be performed.

Figure 6:
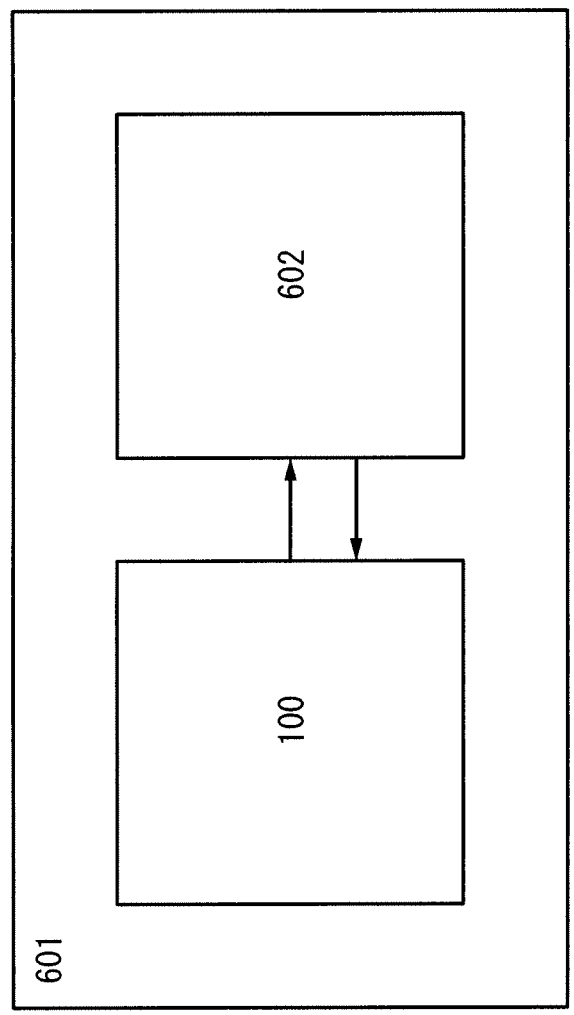
FIG. 6 is an explanatory diagram of a structure of a display device.

An example of a method of changing the threshold value of the binarizing process in accordance with the intensity of the incident light will be described below. FIG. 6 illustrates an example of a structure of a display device 601 of this embodiment. The display device 601 includes at least the display panel 100 and an image processing portion 602.

Figure 14:
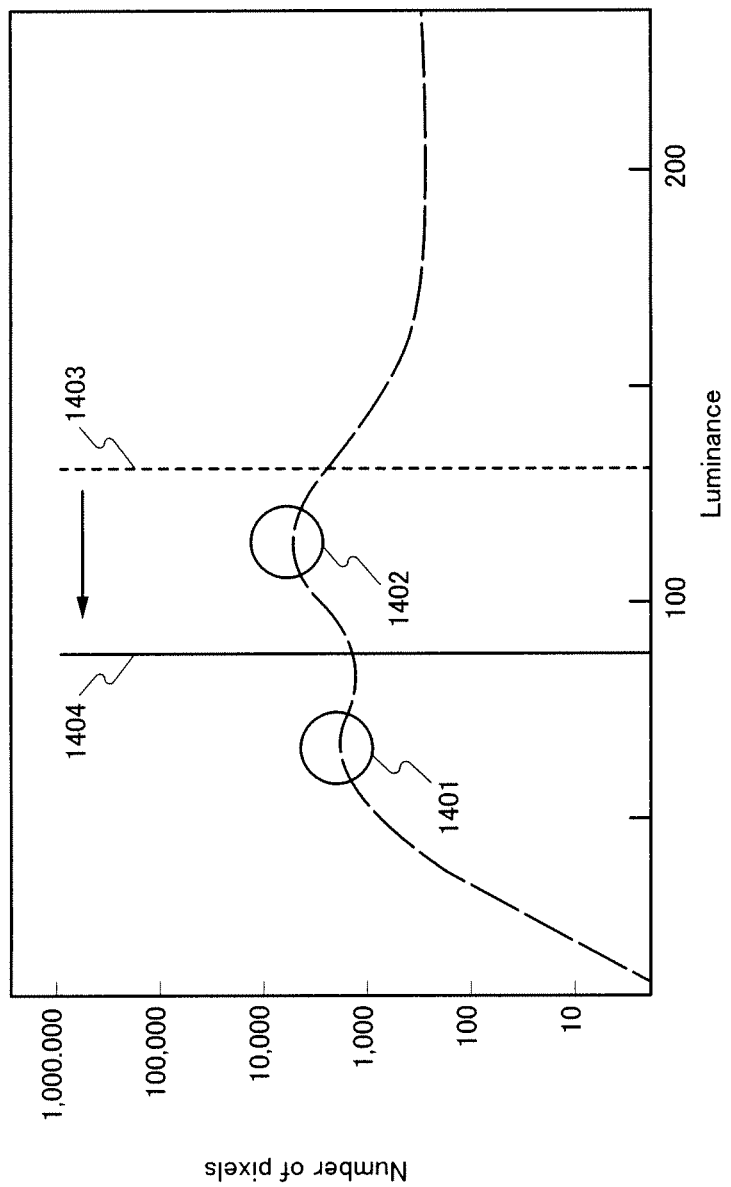
FIG. 14 is a histogram.

First, as in Embodiment 1, the brightness (luminance) of an image of the detected object which is imaged by the display panel 100 is measured for each pixel. In FIG. 14, a peak 1401 indicates the luminance of the position of the detected object and a peak 1402 indicates the luminance of a position except for the position of the detected object. The data of the luminance is transmitted to the image processing portion 602.

In the image processing portion 602, the luminance for each pixel is compared to a threshold value set in advance. Then, when each luminance of pixels gathers to the region values of which are less than the threshold value or the region values of which are the threshold value or more, it is judged that the intensity of the incident light is excessively low or high. Then, the image processing portion 602 supplies a control signal to the photosensor 106 in the display panel 100 so as to change sensitivity of the photosensor 106 in accordance with light incident on the photosensor 106.

For example, in the histogram in FIG. 14, the number of pixels having a luminance less than the threshold value 1403 set in advance is 70% or more of all of the pixels. In this case, it is judged that the intensity of the incident light is excessively low. Therefore, it is difficult to obtain a clear image by the binarizing process with the threshold value 1403. In contrast, it is judged that the intensity of the incident light is excessively high in the case where the number of pixels having a luminance of the threshold value or more is 70% or more of all of the pixels (not illustrated).

When the intensity of the incident light is excessively low or high, the threshold value is changed. In the case of FIG. 14, the threshold value may be changed from the threshold value 1403 to a threshold value 1404 such that the number of pixels the luminance of which is less than 70% of all of the pixels. Thus, the threshold value 1404 can be provided between a peak 1401 indicating the luminance of the position of the detected object and a peak 1402 indicating the luminance of a position except for the position of the detected object. Then, by the binarizing process with the threshold value 1404, the position of the detected object and a position except for the position of the detected object are recognized as a dark portion and a bright portion, respectively.

Further, not only when an object is touched to the display panel but also when the object is not touched to the display panel, detection can be performed. In the case of the object which is not touched, the shade becomes fainter than that of the object which is touched, so that it is difficult to distinguish between brightness and darkness clearly. The threshold value is changed in accordance with incident light, so that imaging a high-resolution image can also be performed on the object which is not touched.

As described above, in the case where the intensity of the incident light is excessively low or high, image processing is performed in accordance with the intensity of incident light, so that the accuracy of imaging can be improved; therefore, misperception of the position of the detected object can be prevented or the obtained image can be clear.

Note that the proportion of gathering pixels is not limited to 70%, and the proportion can be determined by the proportion of the area of the detected object in the whole image or the required accuracy of imaging. Further, a method of changing the threshold value can be used a method other than the above. For example, a method by which the threshold value changed from the threshold value 1403 to a threshold value 1404 which is a value in the valley between the two peaks 1401 and 1402, a method by which the threshold value is changed such that the distribution of two portions separated by the threshold value became maximum, or the like can be used.

Alternatively, image processing may be performed only on a particular region of a pixel, which can make it possible to shorten the processing time.

This embodiment can be implemented in combination with any of other embodiments and examples as appropriate.

(Embodiment 4)

Figure 7:
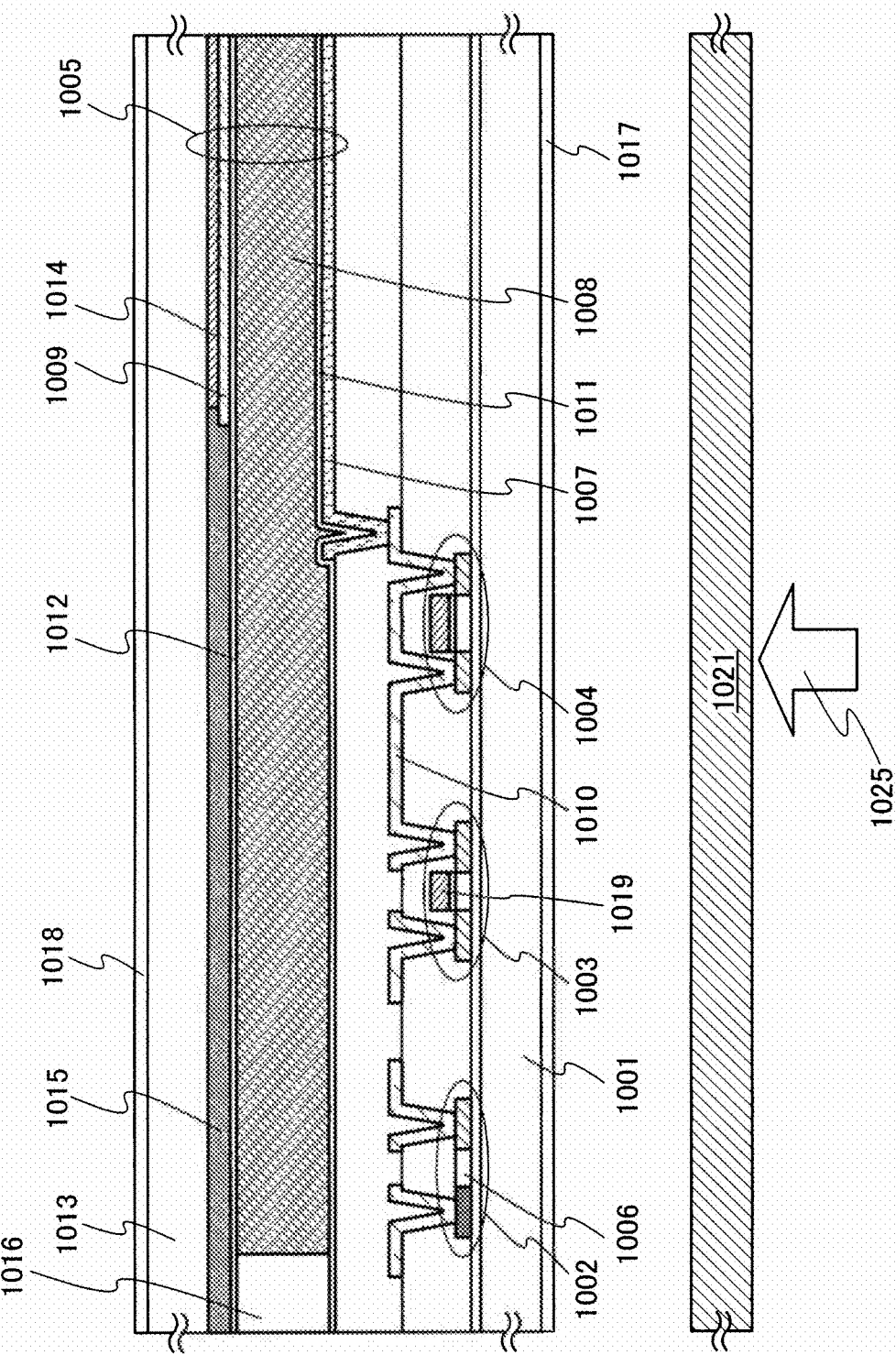
FIG. 7 is an explanatory diagram of a cross section of a display device.

FIG. 7 illustrates an example of a cross-sectional view of the display panel. In the display panel in FIG. 7, a photodiode 1002, a transistor 1003, a storage capacitor 1004, and a liquid crystal element 1005 are provided over a substrate (TFT substrate) 1001 having an insulating surface.

The photodiode 1002 and the storage capacitor 1004 can be formed at the same time as the transistor 1003 is formed in a manufacturing process of the transistor 1003. The photodiode 1002 is a lateral-junction pin diode. A semiconductor film 1006 included in the photodiode 1002 has a region having p-type conductivity (p-type layer), a region having i-type conductivity (i-type layer), and a region having n-type conductivity (n-type layer). Note that although the case where the photodiode 1002 is a pin diode is illustrated in this embodiment, the photodiode 1002 may be a pn diode. Lateral pin junction or lateral pn junction can be formed in such a manner that an impurity imparting p-type conductivity and an impurity imparting n-type conductivity is added to respective particular regions in the semiconductor film 1006.

Further, it is possible to form an island-shaped semiconductor film of the photodiode 1002 and an island-shaped semiconductor film of the transistor 1003 at the same time by processing (patterning) one semiconductor film formed over the TFT substrate 1001 in a desired shape by etching or the like; therefore, a step generally added to a panel manufacturing process is unnecessary, so that cost can be reduced.

Note that a stacked layer of the p-type layer, the i-type layer, and the n-type layer can be used instead of a lateral-junction photodiode.

The liquid crystal element 1005 includes a pixel electrode 1007, liquid crystals 1008, and a counter electrode 1009. The pixel electrode 1007 is formed over the substrate 1001 and is electrically connected to each other through the transistor 1003, the storage capacitor 1004, and a conductive film 1010. Further, a substrate (a counter substrate) 1013 is provided with the counter electrode 1009, and the liquid crystal 1008 are sandwiched between the pixel electrode 1007 and the counter electrode 1009. Note that although a transistor used for a photosensor is not illustrated in this embodiment, the transistor can be formed over the substrate (TFT substrate) 1001 together with the transistor 1003 in the manufacturing process for the transistor 1003.

A cell gap between the pixel electrode 1007 and the counter electrode 1009 can be controlled by using a spacer 1016. Although the cell gap is controlled by the spacer 1016 which is selectively formed by photolithography and has a columnar shape in FIG. 7, the cell gap can alternatively be controlled by sphere spacers dispersed between the pixel electrode 1007 and the counter electrode 1009.

Further, between the substrate (TFT substrate) 1001 and the substrate (the counter substrate) 1013, the liquid crystal 1008 is surrounded by a sealing material. The liquid crystal 1008 may be injected by a dispenser method (droplet method) or a dipping method (pumping method).

For the pixel electrode 1007, a light-transmitting conductive material such as indium tin oxide (ITO), indium tin oxide containing silicon oxide (ITSO), organic indium, organic tin, zinc oxide, indium zinc oxide (IZO) containing zinc oxide, zinc oxide containing gallium, tin oxide, indium oxide containing tungsten oxide, indium zinc oxide containing tungsten oxide, indium oxide containing titanium oxide, indium tin oxide containing titanium oxide, or the like can be used.

In addition, since the light-transmitting liquid crystal element 1005 is given as an example, the above-described light-transmitting conductive material can be used also for the counter electrode 1009 as in the case of the pixel electrode 1007.

An alignment film 1011 is provided between the pixel electrode 1007 and the liquid crystal 1008 and an alignment film 1012 is provided between the counter electrode 1009 and the liquid crystal 1008. The alignment film 1011 and the alignment film 1012 can be formed using an organic resin such as polyimide or polyvinyl alcohol. An alignment treatment such as rubbing is performed on their surfaces in order to align liquid crystal molecules in certain direction. Rubbing can be performed by rolling a roller wrapped with cloth of nylon or the like while applying pressure on the alignment film so that the surface of the alignment film is rubbed in certain direction. Note that by using an inorganic material such as silicon oxide, the alignment film 1011 and the alignment film 1012 each having an alignment property can be directly formed by evaporation method without performing an alignment treatment.

Further, a color filter 1014 capable of transmitting light with a particular wavelength is formed over the substrate (counter substrate) 1013 so as to overlap with the liquid crystal element 1005. The color filter 1014 can be selectively formed by photolithography after an organic resin such as an acrylic-based resin in which pigment is dispersed is applied on the substrate 1013. Alternatively, the color filter 1014 can be selectively formed by etching after a polyimide-based resin in which pigment is dispersed is applied on the substrate 1013. Alternatively, the color filter 1014 can be selectively formed by a droplet discharge method such as an ink jet method.

Further, a shielding film 1015 capable of shielding light is formed on the substrate (the counter substrate) 1013 so as to overlap with the photodiode 1002. The shielding film 1015 not only prevents light from the backlight that passes through the substrate (counter substrate) 1013 and enters the display panel from directly being delivered to the photodiode 1002, but also prevents disclination due to incorrect alignment of the liquid crystals 1008 between the pixels from being identified visually. An organic resin containing black pigment such as carbon black or titanium lower oxide can be used for the shielding film 1015. Alternatively, a film of chromium can be used for the shielding film 1015.

Further, a polarizing plate 1017 is formed on the opposite side of the substrate (the TFT substrate) 1001 over which the pixel electrode 1007 is formed, and a polarizing plate 1018 is formed on the opposite side of the substrate (the counter substrate) 1013 over which the counter electrode 1009 is formed.

The liquid crystal element may be a TN (twisted nematic) mode, a VA (vertical alignment) mode, an OCB (optically compensated birefringence) mode, an IPS (in-plane switching) mode, or the like. Note that although an example of the liquid crystal element 1005 in which the liquid crystals 1008 are sandwiched between the pixel electrode 1007 and the counter electrode 1009 is illustrated in this embodiment, the display panel in one embodiment of the present invention is not limited to this structure. A liquid crystal element in which a pair of electrodes is formed on the substrate (TFT substrate) 1001 side, which is similar to an IPS mode liquid crystal element, may also be used.

In addition, although an example in which a thin semiconductor film is used for the photodiode 1002, the transistor 1003, and the storage capacitor 1004 is illustrated in this embodiment, a single crystal semiconductor substrate, an SOI substrate, or the like can be used for the photodiode 1002, the transistor 1003, and the storage capacitor 1004.

In addition, the light is delivered from the substrate (TFT substrate) 1001 side as shown by an arrow 1025. Since the light is shaded by the object 1021, incident light on the photodiode 1002 is shaded. In other words, the photodiode 1002 detects the shade of the object.

Further, in the case of using light from the back light, light is delivered from the substrate (counter substrate) 1013 side to the object 1021 over the substrate (TFT substrate) 1001 side through the liquid crystal element 1005, and enters the photodiode 1002. That is, light reflected off the object is detected.

Furthermore, in the display device of this embodiment, a light receiving surface of a photosensor (photodiode 1002) and the display surface of the display panel (substrate 1001 side) have the same direction. Therefore, an object can be imaged with the display panel, which is effective for imaging as compared to the case where a CCD image sensor or the like is provided.

This embodiment can be implemented in combination with any of other embodiments and examples as appropriate.

(Embodiment 5)

Figure 8:
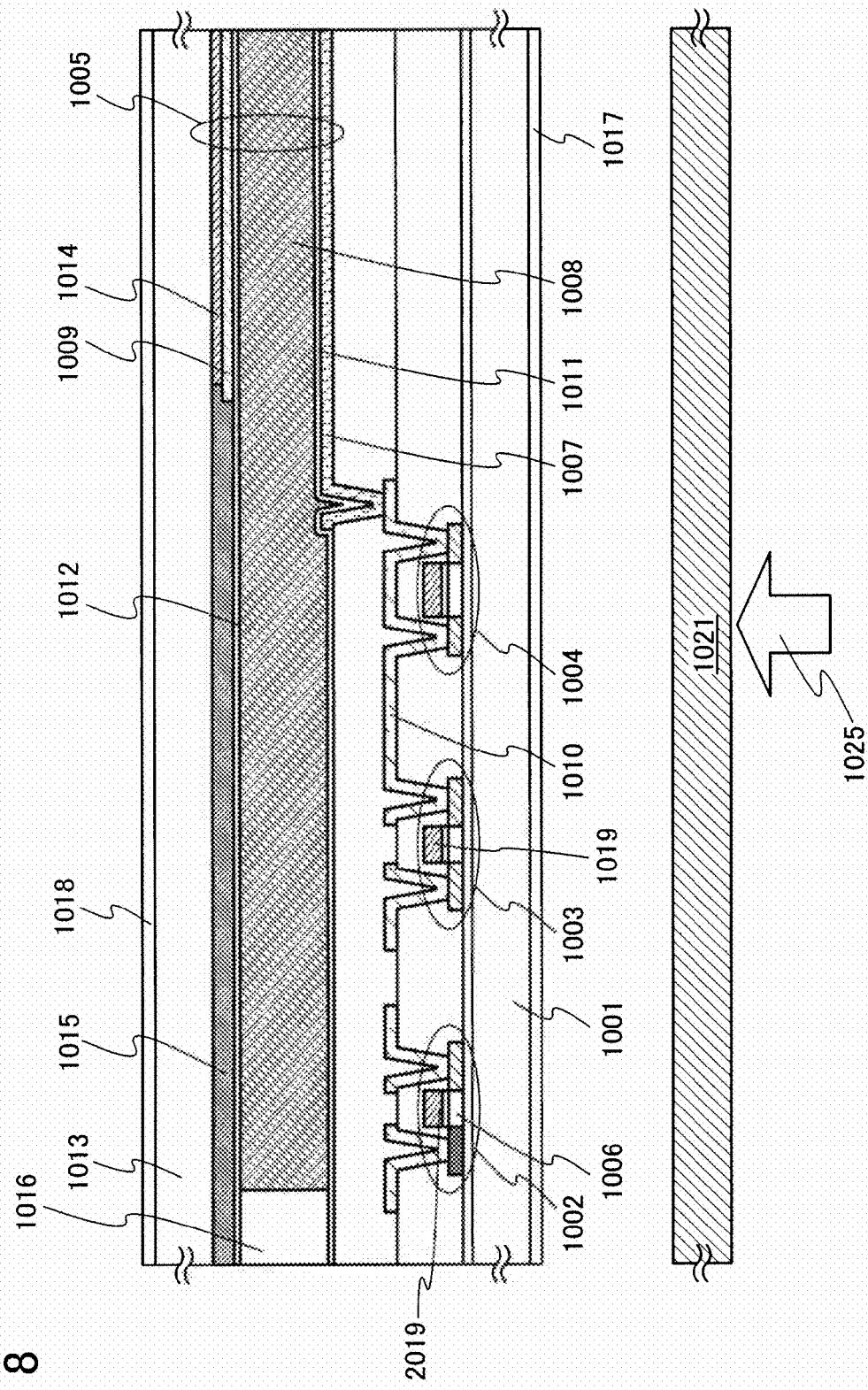
FIG. 8 is an explanatory diagram of a cross section of a display device.

FIG. 8 illustrates a cross-sectional view of a display panel different from that in Embodiment 2. In the display panel illustrated in FIG. 8, the photodiode 1002 differs from that in FIG. 7 in having a shielding film 2019 formed using a conductive film 1019 that is used for a gate electrode of the transistor 1003. By the shielding film in the photodiode 1002, light from the backlight is prevented from directly entering a region which is intrinsic (i-type layer).

Further, in the case where the photodiode 1002 serves as a lateral pin diode, a region that has p-type conductivity (a p-type layer) and a region that has n-type conductivity (n-type layer) can be self-aligned by using the shielding film as a mask. This is effective in manufacturing a small photodiode, in reducing the pixel size, and in improving the aperture ratio.

By employing such a mode, a display panel in which data can be input by detection of the movement of a contactless object can be provided.

Note that although a lateral-junction photodiode is used in FIG. 8, a stacked layer of the p-type layer, the i-type layer, and the n-type layer can alternatively be used.

Note that this embodiment is the same as Embodiment 4 in respect of the incident light on the photodiode 1002, and the directions of the light receiving surface of a photosensor and the display surface of the display panel.

This embodiment can be implemented in combination with any of other embodiments and examples as appropriate.

(Embodiment 6)

Figure 9:
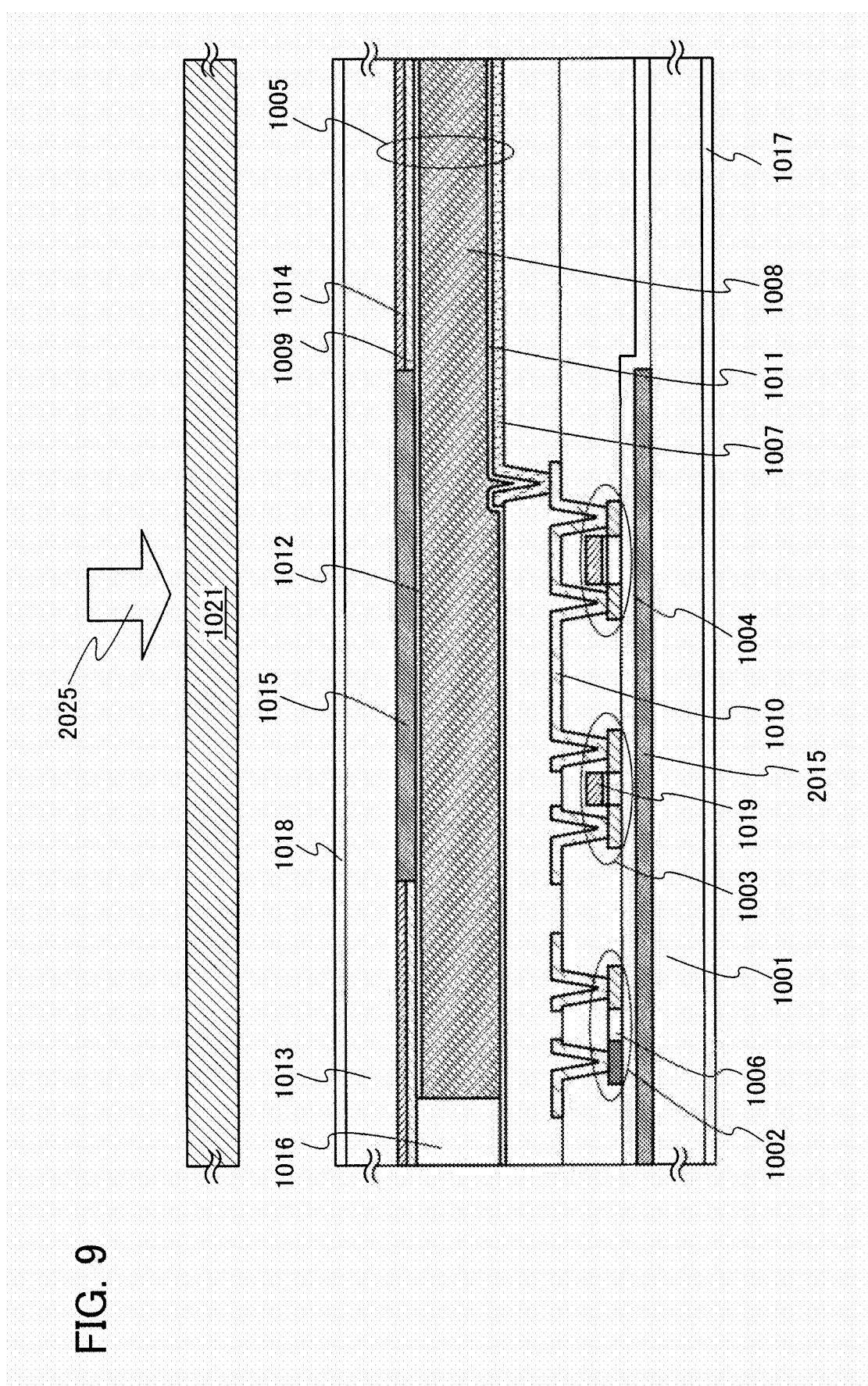
FIG. 9 is an explanatory diagram of a cross section of a display device.

FIG. 9 illustrates another example of a cross-sectional view of a display panel different from the display panel of Embodiment 2. The display panel in FIG. 9 is different form that in FIG. 7 in that light is delivered from the substrate (counter substrate) 1013 side as shown by an arrow 2025. In this case, an opening may be formed in the shielding film 1015 above the photodiode 1002, for example, so that light enters the photodiode 1002.

In this embodiment, a shielding film 2015 is provided below the photodiode 1002. The shielding film 2015 prevents light from the backlight that passes through the substrate (TFT substrate) 1001 and which enters the display panel from directly being delivered the photodiode 1002, so that a display panel capable of imaging a high-resolution image can be provided. An organic resin containing black pigment such as carbon black or titanium lower oxide can be used for the shielding film 2015. Alternatively, a film of chromium can be used for the shielding film 2015.

Note that although a lateral-junction photodiode is used in FIG. 9, a stacked layer of the p-type layer, the i-type layer, and the n-type layer can be alternatively used.

The light receiving surface of the photo sensor (photodiode 1002) faces in the same direction as the display surface of the display panel (toward the substrate 1013); thus, the display panel can image the object.

Further, in the case of using light from the back light, light is delivered from the substrate (TFT substrate) 1001 side to the object 1021 on the substrate (counter substrate) 1013 side through the liquid crystal element 1005, and enters the photodiode 1002. That is, reflecting light from the object is detected.

This embodiment can be implemented in combination with any of other embodiments and examples as appropriate.

(Embodiment 7)

An example of a writing board (such as a blackboard and a whiteboard) using a display panel having a photosensor will be described.

Figure 10:
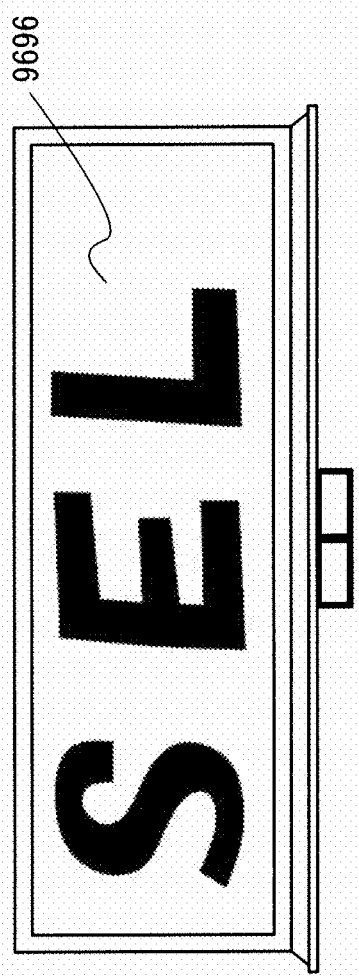
FIG. 10 is an example of an electronic device using a display device.

For example, the display panel including a photosensor is provided at the position of a display panel 9696 in FIG. 10.

The display panel 9696 has a photosensor and a display element.

Here, it is possible to write freely with a marker pen or the like on the surface of the display panel 9696.

Note that it is easy to erase letters if the letters are written with a marker pen or the like without fixer.

In addition, it is preferable that the surface of the display panel 9696 be adequately smooth in order that the ink of the marker pen may be easily removed.

The surface of the display panel 9696 has sufficient smoothness when a glass substrate or the like is used for the surface of the display panel 9696.

Alternatively, a transparent synthetic resin sheet or the like may be attached to the surface of the display panel 9696.

Acrylic resin, for example, is preferably used as the synthetic resin. In this case, the surface of the sheet of synthetic resin is preferably smooth.

Since the display panel 9696 has the display element, a particular image can be displayed on the display panel 9696 and something can be written with the marker pen on the surface of the display panel 9696.

Further, the display panel 9696 has the photosensor, so that letters written with the marker pen can be read and printed out if the display panel 9696 is connected to a printer or the like.

Further, since the display panel 9696 has the photosensor and the display element, by writing text, drawing figures, or the like on the surface of the display panel 9696 with an image displayed, a trail of the marker pen read by the photosensor and the image can be synthesized and displayed on the display panel 9696.

Note that sensing with resistive touch sensors, capacitive touch sensors, or the like can be performed only at the same time as writing with a marker pen or the like.

On the other hand, sensing with a photosensor is superior in that sensing can be performed anytime after something is written with a marker or the like, even if time has passed.

This embodiment can be implemented in combination with any of other embodiments and examples as appropriate.

Example 1

Figure 11:
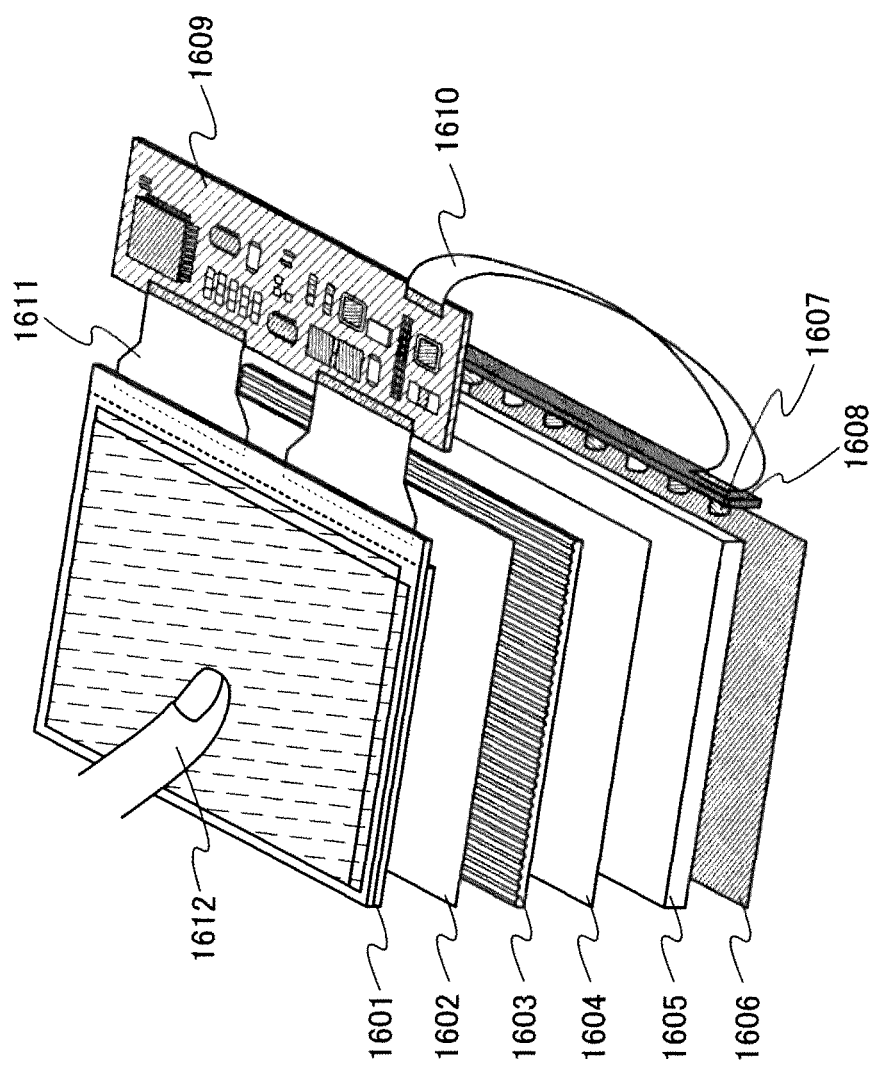
FIG. 11 is an explanatory diagram of a structure of a display device.

In Example 1, positions of a panel and a light source will be described. FIG. 11 is an example of a perspective view illustrating a structure of a display panel. The display panel illustrated in FIG. 11 includes a panel 1601 in which a pixel including a liquid crystal element, a photodiode, a thin film transistor, and the like is formed between a pair of substrates; a first diffuser plate 1602; a prism sheet 1603; a second diffuser plate 1604; a light guide plate 1605; a reflector plate 1606; a backlight 1608 including a plurality of light sources 1607; and a circuit board 1609.

The panel 1601, the first diffuser plate 1602, the prism sheet 1603, the second diffuser plate 1604, the light guide plate 1605, and the reflector plate 1606 are stacked in this order. The light sources 1607 are provided at an end portion of the light guide plate 1605. Light from the light sources 1607 diffused into the light guide plate 1605 is uniformly delivered from the counter substrate side to the panel 1601 with the help of the first diffuser plate 1602, the prism sheet 1603, and the second diffuser plate 1604.

Note that although the first diffusing plate 1602 and the second diffusing plate 1604 are used in Example 1, the number of diffusing plates is not limited thereto. The number of diffusing plates may be one, or may be three or more. The diffuser plate may be provided between the light guide plate 1605 and the panel 1601. Therefore, the diffuser plate may be provided only on the side closer to the panel 1601 than the prism sheet 1603, or may be provided only on the side closer to the light guide plate 1605 than the prism sheet 1603.

Further, the shape of the cross section of the prism sheet 1603, which is illustrated in FIG. 11, is not limited to a serrate shape; the shape may be a shape with which light from the light guide plate 1605 can be gathered to the panel 1601 side.

The circuit board 1609 is provided with a circuit for generating or processing various signals to be input to the panel 1601, a circuit for processing various signals to be output from the panel 1601, and the like. In addition, in FIG. 11, the circuit board 1609 and the panel 1601 are connected to each other through an FPC (flexible printed circuit) 1611. Note that the above circuit may be connected to the panel 1601 by a chip on glass (COG) method, or part of the above circuit may be connected to the FPC 1611 by a chip on film (COF) method.

FIG. 11 illustrates an example in which a control circuit for controlling the driving of the light sources 1607 is provided for the circuit board 1609, and the control circuit and the light sources 1607 are connected to each other through the FPC 1610. However, the above described control circuit may be formed over the panel 1601, and in that case, the panel 1601 and the light sources 1607 are made to be connected to each other through an FPC or the like.

Note that although FIG. 11 illustrates an edge-light type light source in which the light sources 1607 are provided on the edge of the panel 1601, a display panel according to one embodiment of the present invention may be a direct-below type display panel in which the light sources 1607 are provided directly below the panel 1601.

For example, when a finger 1612, an object, gets close to the panel 1601 from the TFT substrate side, part of light that passes through the panel 1601 from the backlight 1608 reflects off the finger 1612 and enters the panel 1601 again. Color image data of the finger 1612, the object, can be obtained by sequentially lighting the light sources 1607 that correspond to individual colors and obtaining image data of every color.

This embodiment can be implemented in combination with any of other embodiments and other examples as appropriate.

Example 2

A display device according to one embodiment of the present invention is characterized by obtaining image data with high resolution. Therefore, an electronic device using the display device according to one embodiment of the present invention can be equipped with a higher-functional application by adding the display device as a component. The display device of the present invention can be used for display devices, laptop computers, or image reproducing devices provided with recording media (typically, devices which reproduce the content of recording media such as DVDs (digital versatile discs), and have displays for displaying the reproduced images). In addition to the above examples, as an electronic device which include the display device according to one embodiment of the present invention, mobile phones, portable game machines, portable information terminals, e-book readers, video cameras, digital still cameras, goggle-type displays (head mounted displays), navigation systems, audio reproducing devices (e.g., car audio components and digital audio players), copiers, facsimiles, printers, multi-function printers, automated teller machines (ATM), vending machines, and the like can be given. Specific examples of such an electronic device are illustrated in FIGS. 12A to 12D.

Figure 12A:
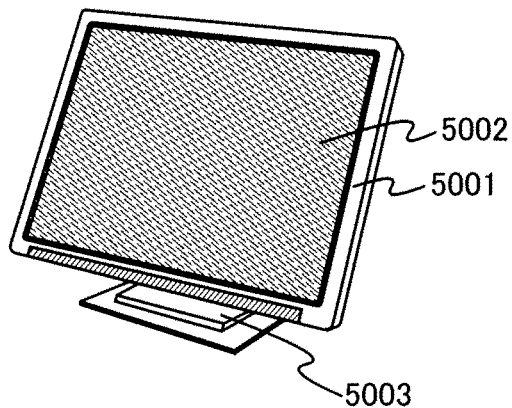
FIGS. 12A to 12D are examples of an electronic device using a display device.

FIG. 12A illustrates a display device including a housing 5001, a display portion 5002, a supporting base 5003, and the like. The display device according to one embodiment of the present invention can be used for the display portion 5002. The use of a display device according to one embodiment of the present invention for the display portion 5002 can provide a display device capable of obtaining image data with high resolution and capable of being equipped with higher-functional applications. Note that the display device includes all display devices for displaying information, such as display devices for personal computers, display devices for receiving TV broadcasts, and display devices for displaying advertisements.

Figure 12B:
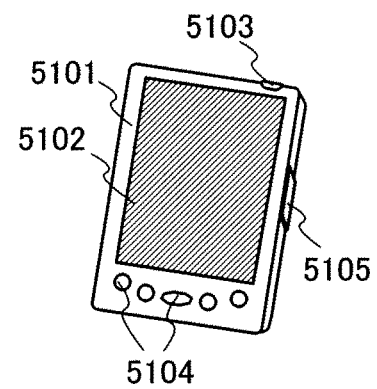

FIG. 12B illustrates a portable information terminal including a housing 5101, a display portion 5102, a switch 5103, operation keys 5104, an infrared rays port 5105, and the like. The display device according to one embodiment of the present invention can be used for the display portion 5102. The use of a display panel according to one embodiment of the present invention for the display portion 5102 can provide a portable information terminal capable of obtaining image data with high resolution and being equipped with higher-functional applications.

Figure 12C:
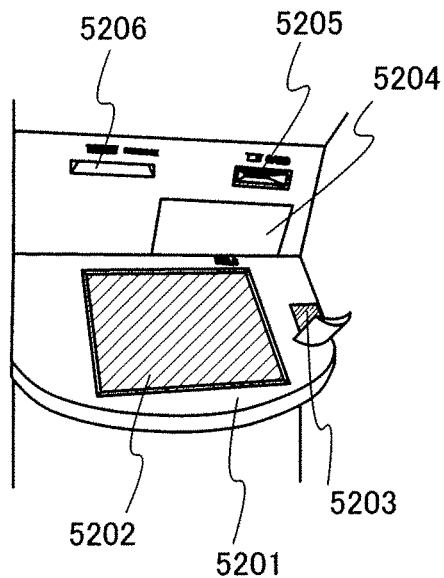

FIG. 12C illustrates an automated teller machine including a housing 5201, a display portion 5202, a coin slot 5203, a bill slot 5204, a card slot 5205, a bankbook slot 5206, and the like. The display device according to one embodiment of the present invention can be used for the display portion 5202. The use of the display device according to one embodiment of the present invention for the display portion 5202 can provide an automated teller machine capable of obtaining image data with high resolution and being equipped with higher-functional applications. The automated teller machine using the display device according to one embodiment of the present invention can read information of living body such as a finger print, a face, a handprint, a palm print, a pattern of a hand vein, an iris, and the like which are used for biometrics with higher accuracy. Therefore, a false non-match rate which is caused by false recognition of a person to be identified as a different person and a false acceptance rate which is caused by false recognition of a different person as a person to be identified can be suppressed.

Figure 12D:
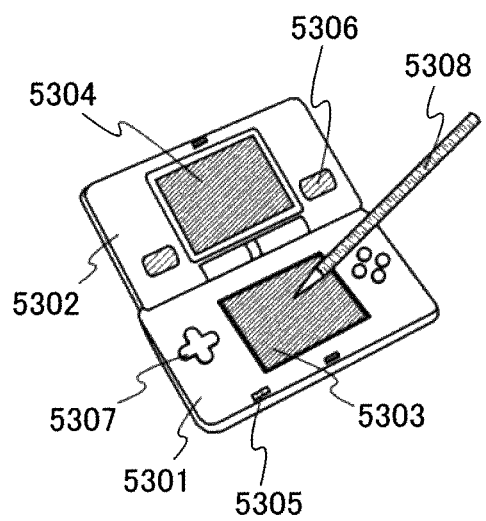

FIG. 12D illustrates a portable game machine including a housing 5301, a housing 5302, a display portion 5303, a display portion 5304, a microphone 5305, speakers 5306, an operation key 5307, a stylus 5308, and the like. The display device according to one embodiment of the present invention can be used for the display portion 5303 or the display portion 5304. The use of the display device according to one embodiment of the present invention for the display portion 5303 or the display portion 5304 can provide a portable game machine capable of obtaining image data with high resolution and being equipped with higher-functional applications. Note that although the portable game machine illustrated in FIG. 12D includes the two display portions 5303 and 5304, the number of display portions included in the portable game machine is not limited to two.

This embodiment can be implemented in combination with any of other embodiments and other examples as appropriate.

This application is based on Japanese Patent Application serial no. 2009-264630 filed with the Japan Patent Office on Nov. 20, 2009, the entire contents of which are hereby incorporated by reference.

What is claimed is:
1. A semiconductor device comprising:
an input portion comprising a photosensor,
wherein the photosensor is configured to obtain a histogram of a luminance of an image of an object by an imaging of the object so that an intensity of an incident light on the photosensor in the imaging is measured by the histogram,
wherein the semiconductor device is configured to change sensitivity of the photosensor in accordance with the intensity of the incident light by using two peaks in the histogram, and
wherein, when the two peaks detected in the histogram are closer to each other, the semiconductor device changes the sensitivity of the photosensor so that two separated peaks are obtained in a histogram after the change of the sensitivity.

2. The semiconductor device according to claim 1, wherein the sensitivity of the photosensor is changed by adjustment of voltage applied to the photosensor.

3. The semiconductor device according to claim 1,
wherein the photosensor comprises a transistor and a photodiode electrically connected to a gate of the transistor, and
wherein the sensitivity of the photosensor is changed by adjustment of voltage applied to the photodiode.

4. The semiconductor device according to claim 1,
wherein the photosensor comprises a transistor and a photodiode electrically connected to a gate of the transistor, and
wherein the sensitivity of the photosensor is changed by adjustment of voltage applied between a source and a drain of the transistor.

5. The semiconductor device according to claim 1,
wherein the photosensor has a function of performing a reset operation, an accumulating operation, and a selecting operation, and
wherein the sensitivity of the photosensor is changed by adjustment of time for the accumulating operation.

6. A display device comprising:
a display panel comprising a photosensor,
wherein the photosensor is configured to obtain a histogram of a luminance of an image of an object by an imaging of the object so that an intensity of an incident light on the photosensor in the imaging is measured by the histogram,
wherein the display device is configured to change sensitivity of the photosensor in accordance with the intensity of the incident light by using two peaks in the histogram, and
wherein, when the two peaks detected in the histogram are closer to each other, the semiconductor device changes the sensitivity of the photosensor so that two separated peaks are obtained in a histogram after the change of the sensitivity.

7. The display device according to claim 6,
wherein the display panel further comprises a pixel, and
wherein the pixel comprises the photosensor.

8. The display device according to claim 6,
wherein the display panel further comprises a pixel circuit,
wherein the pixel circuit comprises a plurality of pixels arranged in a matrix, and
wherein each of the plurality of pixels comprises the photosensor.

9. The display device according to claim 6, wherein the sensitivity of the photosensor is changed by adjustment of voltage applied to the photosensor.

10. The display device according to claim 6,
wherein the photosensor comprises a transistor and a photodiode electrically connected to a gate of the transistor, and
wherein the sensitivity of the photosensor is changed by adjustment of voltage applied to the photodiode.

11. The display device according to claim 6,
wherein the photosensor comprises a transistor and a photodiode electrically connected to a gate of the transistor, and
wherein the sensitivity of the photosensor is changed by adjustment of voltage applied between a source and a drain of the transistor.

12. The display device according to claim 6,
wherein the photosensor has a function of performing a reset operation, an accumulating operation, and a selecting operation, and
wherein the sensitivity of the photosensor is changed by adjustment of time for the accumulating operation.

13. A display device comprising:
a display panel comprising a pixel,
wherein the pixel comprises a photosensor,
wherein the photosensor is configured to obtain a histogram of a luminance of an image of an object by a first imaging of the object so that an intensity of an incident light on the photosensor in the first imaging is measured by the histogram,
wherein the display device is configured to change sensitivity of the photosensor in accordance with the intensity of the incident light by using two peaks in the histogram to perform a second imaging of the object with the changed sensitivity of the photosensor, and
wherein, when the two peaks detected in the histogram are closer to each other, the semiconductor device changes the sensitivity of the photosensor so that two separated peaks are obtained in a histogram after the change of the sensitivity.

14. The display device according to claim 13, wherein the sensitivity of the photosensor is changed by adjustment of voltage applied to the photosensor.

15. The display device according to claims 13,
wherein the photosensor comprises a transistor and a photodiode electrically connected to a gate of the transistor, and
wherein the sensitivity of the photosensor is changed by adjustment of voltage applied to the photodiode.

16. The display device according to claims 13,
wherein the photosensor comprises a transistor and a photodiode electrically connected to a gate of the transistor, and
wherein the sensitivity of the photosensor is changed by adjustment of voltage applied between a source and a drain of the transistor.

17. The display device according to claims 13,
wherein the photosensor has a function of performing a reset operation, an accumulating operation, and a selecting operation, and
wherein the sensitivity of the photosensor is changed by adjustment of time for the accumulating operation.

18. The semiconductor device according to claim 1, wherein one of the two peaks corresponds to a luminescence of the object and the other of the two peaks corresponds to a luminescence except for the object.

19. The display device according to claim 6, wherein one of the two peaks corresponds to a luminescence of the object and the other of the two peaks corresponds to a luminescence except for the object.

20. The display device according to claim 13, wherein one of the two peaks corresponds to a luminescence of the object and the other of the two peaks corresponds to a luminescence except for the object.

* * * * *